United States Patent
Hurtta et al.

(10) Patent No.: US 11,940,763 B2
(45) Date of Patent: Mar. 26, 2024

(54) DISPLAY ASSEMBLY FOR A WEARABLE DEVICE

(71) Applicant: Suunto Oy, Vantaa (FI)

(72) Inventors: Ari Hurtta, Vantaa (FI); Tapio Savolainen, Vantaa (FI); Kari Mäkeläinen, Vantaa (FI)

(73) Assignee: Suunto Oy, Vantaa (FI)

( * ) Notice: Subject to any disclaimer, the term of this patent is extended or adjusted under 35 U.S.C. 154(b) by 0 days.

(21) Appl. No.: 18/218,598

(22) Filed: Jul. 6, 2023

(65) Prior Publication Data

US 2024/0012365 A1  Jan. 11, 2024

(30) Foreign Application Priority Data

Jul. 6, 2022  (FI) .................................. 20225635

(51) Int. Cl.
| | |
|---|---|
| *G04G 17/04* | (2006.01) |
| *G04C 10/02* | (2006.01) |
| *G06F 1/16* | (2006.01) |
| *G06F 3/0354* | (2013.01) |

(52) U.S. Cl.
CPC .......... *G04G 17/045* (2013.01); *G04C 10/02* (2013.01); *G06F 1/163* (2013.01); *G06F 1/1635* (2013.01); *G06F 3/03547* (2013.01); *G06F 2200/16* (2013.01); *G06F 2203/033* (2013.01)

(58) Field of Classification Search
CPC ...... G04G 17/045; G04C 10/02; G06F 1/163; G06F 1/1635; G06F 3/03547
See application file for complete search history.

(56) References Cited

U.S. PATENT DOCUMENTS

| | | | |
|---|---|---|---|
| 6,122,226 A * | 9/2000 | Murakami | G04C 10/02 368/80 |
| 2012/0057439 A1* | 3/2012 | Shimizu | H01L 31/0445 257/E31.113 |
| 2013/0258820 A1* | 10/2013 | Ohiso | H01L 31/02 368/205 |
| 2015/0199062 A1* | 7/2015 | Lang | H04N 21/42204 345/173 |
| 2016/0070238 A1* | 3/2016 | Dubois | G04G 17/045 368/84 |
| 2016/0098115 A1 | 4/2016 | Ren et al. | |
| 2020/0124892 A1* | 4/2020 | Hanshew | G04G 21/08 |
| 2020/0302880 A1* | 9/2020 | Ishida | G04G 9/0064 |

FOREIGN PATENT DOCUMENTS

| | | |
|---|---|---|
| CN | 209859119 U | 12/2019 |
| KR | 20150118755 A | 10/2015 |
| WO | WO2022038293 A1 | 2/2022 |

* cited by examiner

*Primary Examiner* — Edwin A. Leon
(74) *Attorney, Agent, or Firm* — Laine IP Oy

(57) ABSTRACT

There is provided a display assembly for a wearable device, the display assembly comprising: a solar cell layer; and a touch sensor layer, wherein the solar cell layer is arranged above the touch sensor layer, wherein the solar cell layer comprises photovoltaic material arranged at an edge region of the display assembly leaving a uniform central region of the touch sensor layer uncovered.

15 Claims, 11 Drawing Sheets

DISPLAY ASSEMBLY FOR A WEARABLE DEVICE

FIELD

Various example embodiments relate to wearable devices, particularly to a display assembly for a wearable device.

BACKGROUND

Wearable devices, such as smart watches and fitness trackers, have a rechargeable battery. A user of the wearable device needs to take off the wearable device to charge it using a charging cable. Thus, it is desirable to lengthen the time between such charging.

SUMMARY

According to some aspects, there is provided the subject-matter of the independent claims. Some example embodiments are defined in the dependent claims. The scope of protection sought for various example embodiments is set out by the independent claims. The example embodiments and features, if any, described in this specification that do not fall under the scope of the independent claims are to be interpreted as examples useful for understanding various example embodiments.

According to a first aspect, there is provided a display assembly for a wearable device, the display assembly comprising: a solar cell layer; and a touch sensor layer, wherein the solar cell layer is arranged above the touch sensor layer, wherein the solar cell layer comprises photovoltaic material arranged at an edge region of the display assembly leaving a uniform central region of the touch sensor layer uncovered.

According to an embodiment, the photovoltaic material is in a form of a ring, a square or a rectangle.

According to an embodiment, the display assembly comprises: a display panel arranged below the touch sensor layer.

According to an embodiment, the display panel comprises a memory in pixel display, a liquid crystal display, organic light-emitting diode display, active-matrix organic light-emitting diode display, passive-matrix organic light-emitting diode display, micro light emitting diode display, or electronic paper display.

According to an embodiment, the display panel comprises photovoltaic material arranged in between individual pixel components of the display panel.

According to an embodiment, the solar cell layer and the touch sensor layer are integrated on a same substrate.

According to an embodiment, the touch sensor layer and the display panel are integrated on a same substrate.

According to an embodiment, the display assembly comprises: a cover glass.

According to an embodiment, the solar cell layer and the touch sensor layer and the cover glass are integrated on a same substrate.

According to an embodiment, the solar cell layer, the touch sensor layer, the display panel and the cover glass are integrated on a same substrate.

According to an embodiment, the display assembly comprises a flexible printed circuit arranged to connect a touch sensor of the touch sensor layer and the solar module to a processor.

According to an embodiment, the photovoltaic material comprises an opening for an ambient light sensor.

According to an embodiment, the photovoltaic material comprises a plurality of openings through which the display panel is visible.

According to an embodiment, a touch sensor of the touch sensor layer extends at the edge region of the display assembly below the photovoltaic material.

According to a second aspect, there is provided a wearable device, comprising the display assembly according to any preceding claim.

According to an embodiment, the wearable device comprises: a battery; and a charge controller configured to control charging of the battery with electricity produced by the photovoltaic material.

DETAILED DESCRIPTION

Figure 1:
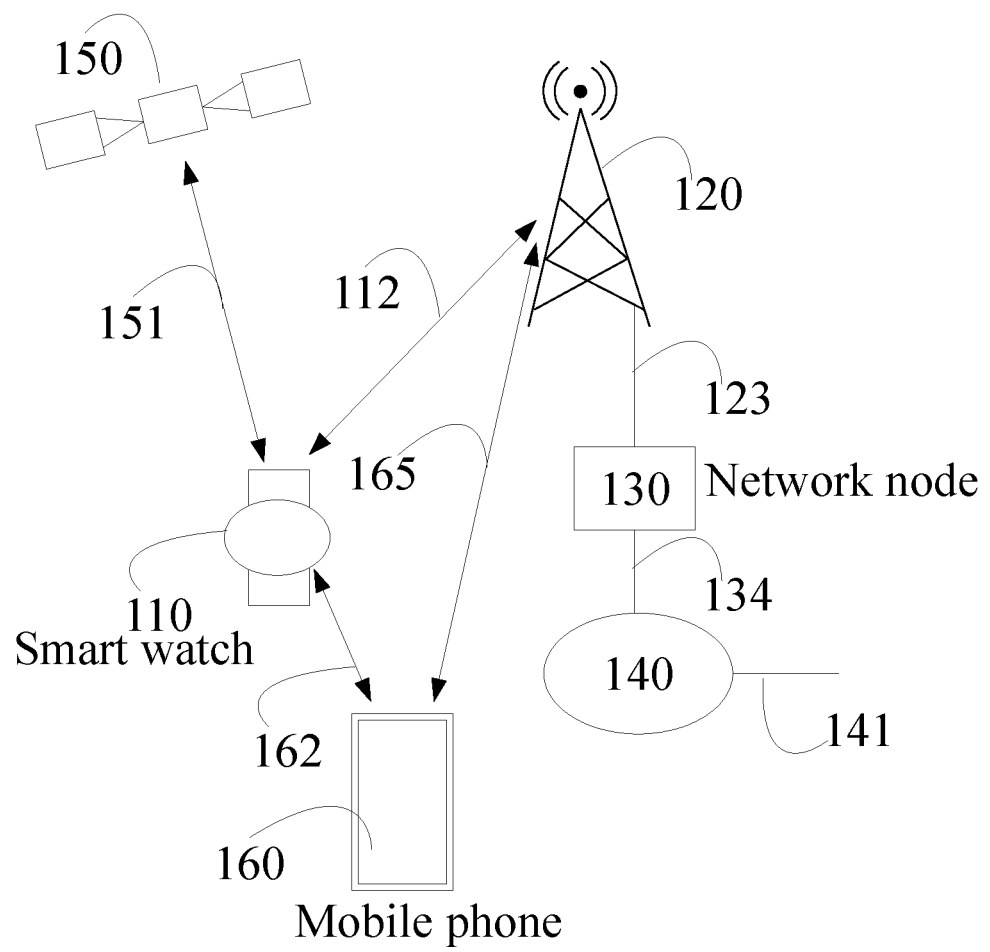
FIG. 1 shows, by way of example, a system.

FIG. 1 shows, by way of example, a system 100. The system comprises device 110, which may comprise, for example, a wearable device such as a smart watch, sport watch, digital watch, or an activity bracelet. Device 110 may comprise a display or a display assembly, which may comprise a touch screen display, for example. Device 110 may be powered, for example, by a rechargeable battery.

Device 110 may be communicatively coupled with a communications network. For example, in FIG. 1 device 110 is coupled, via wireless link 112, with base station 120. Base station 120 may comprise a cellular or non-cellular base station, wherein a non-cellular base station may be referred to as an access point. Examples of cellular technologies include wideband code division multiple access, WCDMA, and long term evolution, LTE, while examples of non-cellular technologies include wireless local area network, WLAN, and worldwide interoperability for microwave access, WiMAX. Base station 120 may be coupled with network node 130 via connection 123. Connection 123 may be a wire-line connection, for example. Network node 130 may comprise, for example, a controller or gateway device.

Network node 130 may interface, via connection 134, with network 140, which may comprise, for example, the Internet or a corporate network. Network 140 may be coupled with further networks via connection 141. In some embodiments, device 110 is not configured to couple with base station 120. Network 140 may comprise, or be communicatively coupled, with a back-end server, for example.

Communication between the device 110 and the communication network may be realized via another user device, e.g. a mobile phone 160 or a personal computer such as a laptop. The device 110 may communicate with a user device via a wireless or wired connection. For example, the device 110 may communicate with the mobile phone 160 using a wireless connection 162 such as Bluetooth. The mobile phone 160 may have an application installed which may be configured to establish a communication connection 165 with the network such that the device 110 may, for example, receive data from the network and transmit data to the network via the mobile phone 160. As an example of a wired connection, the device 110 may be connected via a data cable, e.g. universal serial bus (USB) cable, to a laptop. The laptop may have a program installed which may be used to sync data between the device 110 and a web service in the network, for example.

Device 110 may be configured to receive, from satellite constellation 150, satellite positioning information via satellite link 151. The satellite constellation may comprise, for example the global positioning system, GPS, or the Galileo constellation. Satellite constellation 150 may comprise more than one satellite, although only one satellite is illustrated in FIG. 1 for the sake of clarity. Likewise, receiving the positioning information over satellite link 151 may comprise receiving data from more than one satellite.

Alternatively or additionally to receiving data from a satellite constellation, device 110 may obtain positioning information by interacting with a network in which base station 120 is comprised. For example, cellular networks may employ various ways to position a device, such as trilateration, multilateration or positioning based on an identity of a base station with which attachment is possible or ongoing. Likewise a non-cellular base station, or access point, may know its own location and provide it to device 110, enabling device 110 to position itself within communication range of this access point. The device 110 may be part of an indoor positioning system employing wireless technologies such as Bluetooth or Wi-Fi for locating.

Device 110 may be configured to obtain a current time from satellite constellation 150, base station 120 or by requesting it from a user, for example. Once device 110 has the current time and an estimate of its location, device 110 may consult a look-up table, for example, to determine a time remaining until sunset or sunrise, for example. Device 110 may likewise gain knowledge of the time of year.

Device 110 may comprise, or be coupled with, at least one sensor, such as, for example, an acceleration sensor, altimeter, moisture sensor, temperature sensor, heart rate (HR) sensor, ambient light sensor, and/or a blood oxygen level sensor. Device 110 may be configured to produce and store, using the at least one sensor, sensor data, for example in a time series that comprises a plurality of samples taken in a time sequence. In some embodiments, device 110 comprises an acceleration sensor and a HR sensor. In some further examples, device 110 comprises an acceleration sensor, a HR sensor and an altimeter. For example, the device 110 may comprise a digital compass.

The acceleration sensor, or motion sensor, may comprise e.g. a 6 degrees of freedom (DoF), or 9 DoF inertial measurement unit (IMU). The acceleration sensor may comprise e.g. a 3D digital accelerometer and/or a 3D digital gyroscope. A full-scale acceleration range of $\pm 2/\pm 4/\pm 8/\pm 16$ g and an angular rate range of $\pm 125/\pm 250/\pm 500/\pm 1000/\pm 2000/\pm 4000$ degrees per second (dps) may be supported. The acceleration sensor may comprise a 3D magnetometer, for example.

Measurement of the heart rate may be electrical or optical. Electrical measurement is based on electrocardiography sensors worn on a chest strap. Optical measurement is based on photoplethysmography (PPG) sensors which emit light from light emitting diodes through the skin, e.g. on a wrist, and measure how the light scatters off the blood vessels under the skin.

For charging the rechargeable battery using a charger cable, a user takes off the wearable device and needs to interrupt usage of the device. Wearable devices may be equipped with a solar panel configured to charge a battery of the wearable device with solar energy. However, integration of the solar panel with a touch screen, which is often used as a user interface in wearable devices, may be cumbersome.

Photovoltaic material in solar cells or photovoltaic (PV) cells convert the energy of light into electricity. The phenomenon behind the conversion is the photovoltaic effect. A solar panel may be formed of a cell, or a plurality of solar cells may be connected together to form a solar panel. For example, the cells may be connected in series. Alternatively, the cells may be connected in parallel. The light source may be sunlight or artificial light.

Light photons are collected by the solar cell and absorbed by semiconducting materials. Negatively charged electrons are excited from their orbital, and electron-hole pairs are created. A voltage difference is created between the free electrons and the holes, and this voltage difference may be used to charge a battery via a charge controller or harvester.

Material used in the solar cell may be, for example, monocrystalline silicon, polycrystalline silicon, gallium arsenide (GaAs), copper indium gallium selenide (CIGS), darmstadtium tellurium (DsTe), organic, dye-sensitized, quantum dot, amorphous silicon (A-Si) or perovskite.

Touch sensors may be, for example, capacitive touch sensors or resistive touch sensors. In general, sensitivity of the capacitive touch sensors is higher than sensitivity of the resistive touch sensors.

For example, surface capacitive touch sensors comprise a thin electrode layer or film under a protective layer, e.g. a glass layer. Voltage is applied for the electrode film. When a finger touches the touch panel, a small electrical charge is transferred to the finger, which creates a voltage drop on that point of the touch panel. This voltage drop is may be detected.

As a further example, projected capacitive touch sensors comprise a grid pattern of electrodes on the electrode layer. The X and Y electrodes may be formed on one sheet or on separate sheets. The pattern forms the plane of X and Y coordinates, which the controller uses to determine the touch point. The grid pattern may be made of transparent material, such as indium-tin oxide (ITO). Certain materials, for example, photovoltaic material, between the capacitive touch sensor and the finger, may disturb the functionality of the capacitive touch sensor. Those certain materials above the capacitive touch sensor decrease the sensitivity of the touch sensor, especially in difficult circumstances, for example, if there are water droplets on the touch screen or the user wears gloves.

As another example, resistive touch sensors comprise transparent electrically conductive and resistive layers. For example, an insulating substrate, e.g. a glass or plastic substrate such as acrylic substrate, may be topped by flexible plastic layers, for example, polyethylene terephthalate (PET) layers. The PET layers are coated with a conductive layer, e.g. indium-tin oxide (ITO) layer. The conductive layers are separated by a small gap. When operating, an electrical current is applied through the touch sensor. When a force is applied on the touch sensor or touch panel, the ITO layers come into contact which causes a change in the electrical current. A flexible printed circuit (FPC) connects the touch sensor to a processor or a controller. The change in the current may be detected by the controller, which determines coordinates based on the touches.

Figure 2A:
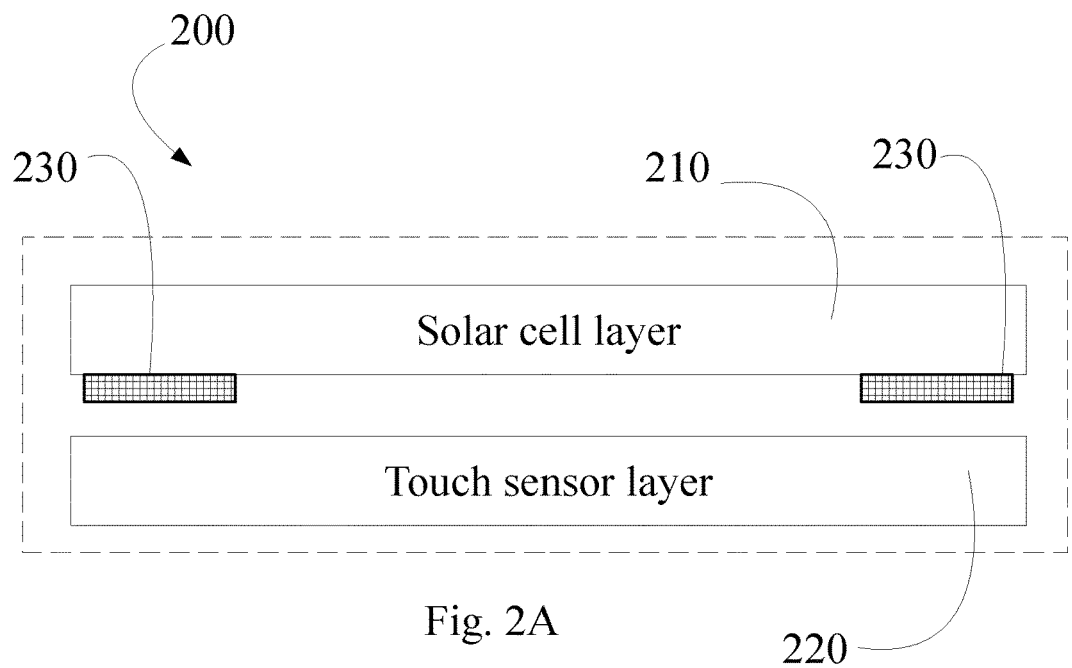
FIG. 2A shows, by way of example, a cross-sectional side view of a display assembly.

FIG. 2A shows, by way of example, a cross-sectional side view of a display assembly 200. The drawing is a schematic drawing of a display assembly. The display assembly may comprise one or more other layers, parts or elements, as shown, for example, in FIG. 3. In at least some embodiments, the display assembly 200 of FIG. 2A is a display subassembly.

Figure 2B:
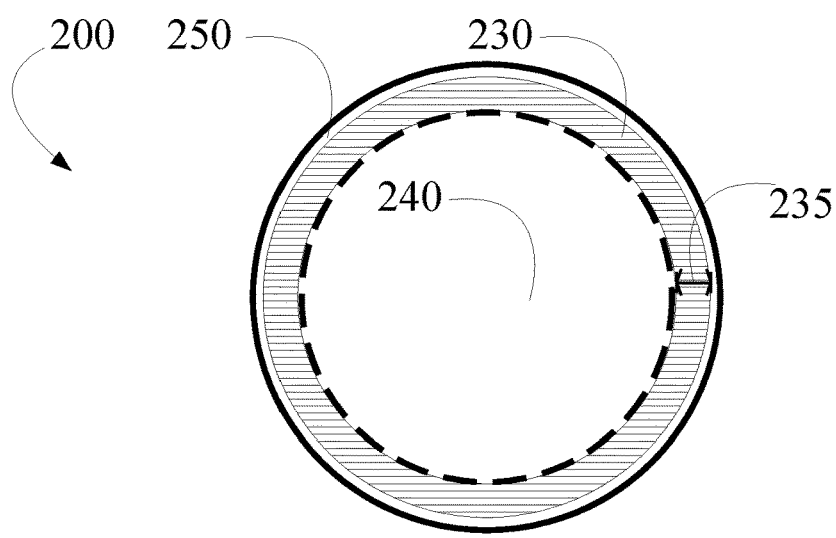
FIG. 2B shows, by way of example, a top view of a display assembly.

FIG. 2B shows, by way of example, a top view of the display assembly 200.

The display assembly 200 comprises at least a solar cell layer 210 and a touch sensor layer 220. The solar cell layer 210 is arranged above the touch sensor layer 220. When the solar cell layer is above the touch sensor layer and thus closer to the surface of the display assembly 200, more light can be collected to be converted to electricity by the solar cell comprised on the solar cell layer.

The solar cell layer 210 or a solar cell substrate comprises photovoltaic material 230, or a solar module or solar panel comprising at least one solar cell arranged at an edge region of the display assembly 200 leaving a uniform central region 240 of the touch sensor layer 220 uncovered by the photovoltaic material. Photovoltaic material is arranged at a peripheral region or a peripheral area of the display assembly, as is shown, for example, in FIG. 2B and FIG. 2C. The uniform central region 240 may also be referred to as an active area of the display, or a visible area of the display, or a viewing area of the display. A uniform central region of a display panel, which may be arranged below the touch sensor layer, is uncovered by the photovoltaic material 230 of the solar cell layer 210. The uniform central region 240 is illustrated by a dashed line in FIG. 2B. A majority of the display panel and the touch sensor layer is not covered by the photovoltaic material 230, so there is no absorbing photovoltaic layer in front of the display panel such that it would disturb visibility of information shown on the display. Thus, a user of the wearable device may easily see what is displayed on the display, and the wearable device face area may be utilized optimally. Functionality of the touch sensor is not disturbed by the solar module, because the solar module is at the edge region of the wearable device face area. For example, the solar module may be arranged so that it covers only the edge region of the wearable device face area. Solar module arranged at the edge does not absorb light of the display in the uniform central region 240. In case of reflective display, the display contrast may be enhanced which improves the common problem of visibility of reflective display information in low ambient light conditions. For transmissive and emissive displays, the edge solar module improves the display transmissivity and emissivity performance due to lower loss of the light in the visible area (uniform central region 240) of the display module.

Use of a cell (one cell) instead of a plurality of cells connected together results in a uniform solar surface without insulating gaps between the plurality of cells. However, the solar module may comprise a plurality of cells. The choice between one cell and a plurality of cells may be a trade-off between visual appearance and harvested voltage.

A flexible printed circuit (FPC) is used to connect the touch sensor to a processor of the wearable device. When the FPC is bent, there is always some space at the edge region that is reserved for the bending radius of the FPC. The solar module as disclosed herein makes efficient use of this space.

In case the touch sensor has been integrated into the display panel, the touch sensor and the display may share the same connection medium, e.g. FPC or chip on foil (COF) or a flexible substrate tail. Also in this case, there is some space at the edge region that is reserved for connecting the layers of the display assembly to the main circuitry of the wearable device. The solar module as disclosed herein makes efficient use of this space.

A thin area 250 in between the outer circumference or perimeter of a housing of the display assembly 200 and the solar module 230 may be covered by a print painted to cover inner structures of the display assembly. For example, FPCs or other components may otherwise be visible through a cover glass. Thus, a back print may be applied on the cover glass using silk screen or some other printing method.

The solar module or solar panel 230 may have a form of a ring, as in the example of FIG. 2B. Alternatively, the solar module may have a form of a square as in the example of FIG. 2C, or a form of a rectangle, for example. Form of the solar module may be decided based on the form of the display housing or case of the wearable device.

Figure 2C:
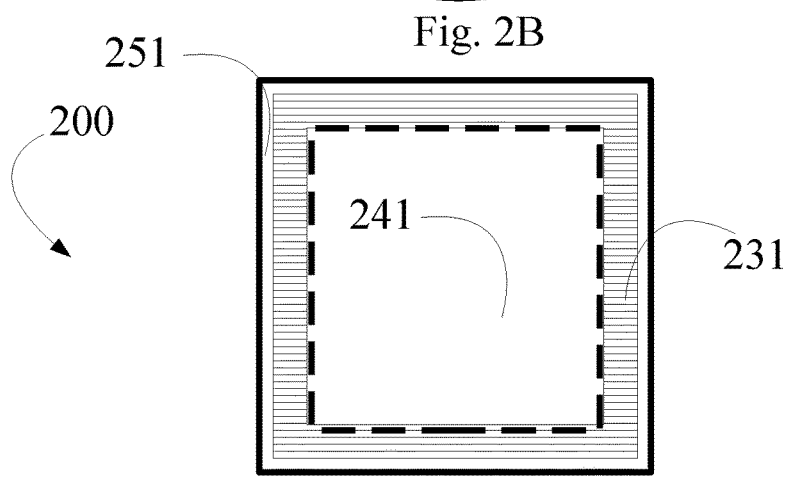
FIG. 2C shows, by way of example, a top view of a display assembly.

FIG. 2C shows, by way of example, a top view of the display assembly 200. Parts 231, 241, 251 correspond to the parts 230, 240 250, respectively. FIG. 2C shows an example of a display assembly comprising a solar module 231 having a form of a square.

In some embodiments, width 235 of the solar module 230 may be larger than 3 mm, for example, 3.21 mm, 3.19 mm, 3.20 mm, or 3.22 mm. The total solar area, or the active photovoltaic area, of the solar module may be, for example, larger than 380 mm$^2$, for example, 385 mm$^2$, 384 mm$^2$, 386 mm$^2$. The measures of the solar area may be a design option depending on the total size of the display assembly, for example.

Figure 3:
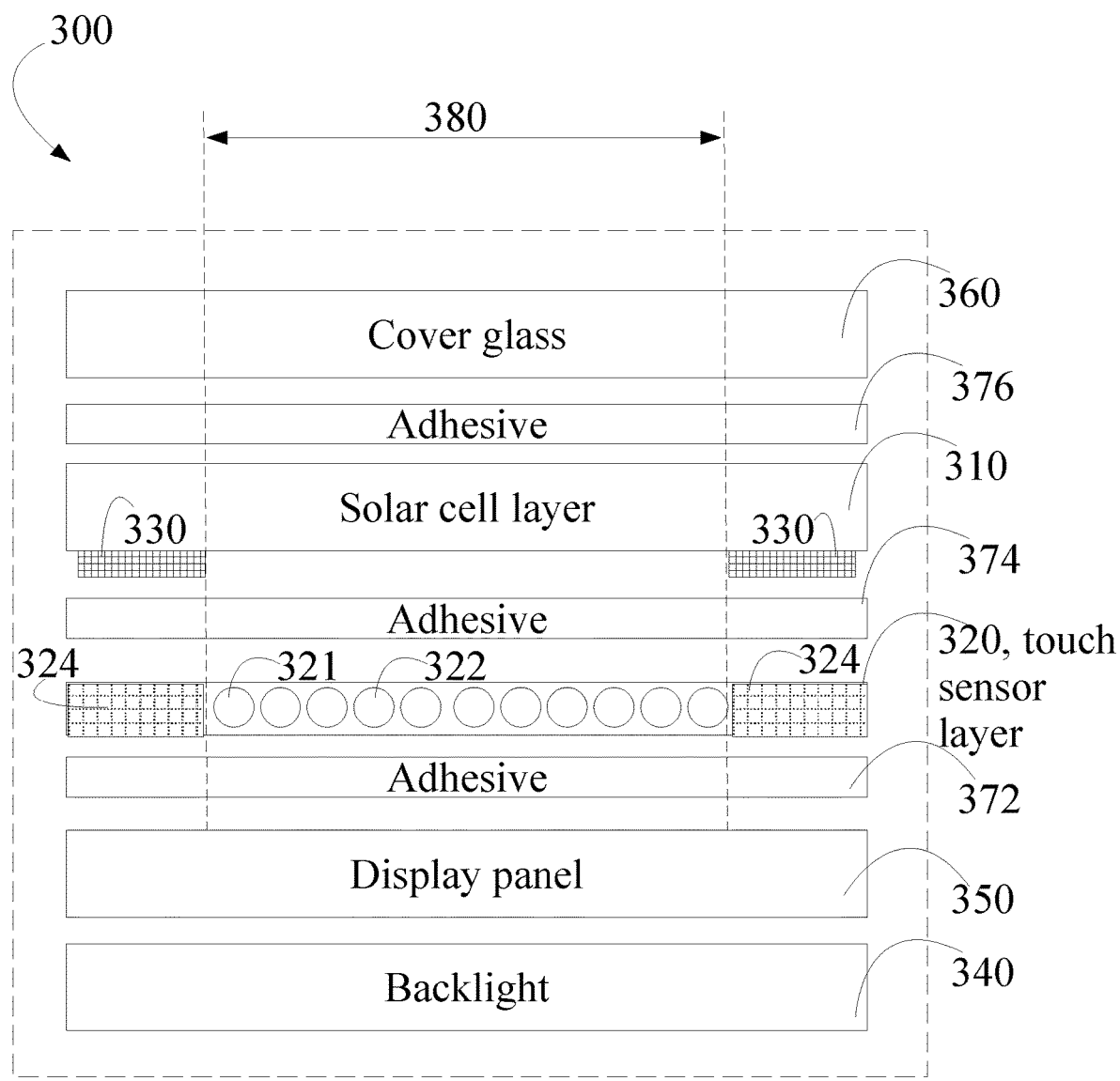
FIG. 3 shows, by way of example, a cross-sectional side view of a display assembly.

FIG. 3 shows, by way of example, a cross-sectional side view of a display assembly 300. The drawing is a schematic drawing of a display assembly. FIG. 3 shows a more detailed view of the display assembly than FIG. 2.

The display assembly 300 comprises a solar cell layer 310 and a touch sensor layer 320. Circles 321, 322 represent the row and column traces of the touch sensor. Traces are made of transparent material, e.g. ITO. The solar cell layer 310 is arranged above the touch sensor layer 320. The solar cell layer 310 comprises photovoltaic material 330 or a solar module comprising at least one solar cell arranged at an edge region of the display assembly leaving a uniform central region 380 of the touch sensor layer uncovered by the photovoltaic material. The uniform central region 380 may also be referred to as an active area of the display, or a visible area of the display, or a viewing area of the display. The uniform central region 380 of the display panel 350 is uncovered by the photovoltaic material 330 of the solar cell layer 310. Area 324 in the touch sensor layer 320, under the photovoltaic material, represents routing area with conductors, e.g. copper or silver conductors. Photovoltaic material 330 arranged at the edges of the display assembly and above the touch sensor layer covers the routing area 324, so no other means, such as printed logos etc. might not be needed to cover the conductors on the routing area.

The display assembly 300 comprises a display panel. The display panel may be, for example, reflective, transmissive, emissive or transreflective mode display. For example, the display panel may be a memory in pixel (MIP) display, liquid crystal display (LCD), organic light-emitting diode (OLED) display or active-matrix organic light-emitting diode (AMOLED) display, or electronic paper (e-paper) display. Benefit of using solar cell in a display assembly may be emphasized with display panels with low power consumption. MIP display and e-Paper display are examples of a display with low power consumption.

The display panel 350 is arranged below the touch sensor layer 320.

In case the display panel is not an emissive type of a display panel without own light sources, for example, in case of the transmissive display panel, the display assembly may comprise a backlight 340. Alternatively, for example, in the case of reflective display panel, the display assembly may comprise a frontlight.

As a further example, a display may comprise reflective and transmissive characteristics. This kind of a display may be named as a transreflective display, and a backlight may be used to display image on transmissive parts of the display.

As a further example, emissive displays comprise LEDs, which produce the light needed. Examples of emissive displays comprise OLED display and microLED display. Examples of OLED displays comprise AMOLED display and passive-matrix OLED (PMOLED) display.

The display assembly 300 comprises a cover glass 360 to protect the underlying structures of the display assembly. For example, the cover glass may be a sapphire crystal glass layer, mineral glass layer, or plastic layer. Thickness of the cover glass may be, for example, approximately 1.5 mm.

Adhesive layers 372, 374, 376 may be arranged in between the layers. Adhesive may be, for example, optically clear adhesive (OCA).

Alternatively, some layers may be integrated on the same substrate or subassembly. The substrate or substrates of the display assembly may be, for example, glass substrate(s) or plastic substrate(s). For example, the solar cell layer 310 and the touch sensor layer 320 may be integrated on the same substrate. For example, the photovoltaic material 330 and the touch sensor pattern may be deposited on a solar cell substrate. This way, an adhesive lamination may be avoided in between the solar cell layer 310 and the touch sensor layer 320.

As another example, the solar cell layer 310 and the touch sensor layer 320 and the cover glass 360 may be integrated on the same substrate. For example, the solar cell and the touch sensor pattern may be deposited on a cover glass substrate.

As another example, the touch sensor layer 320 and the display panel 350 may be integrated on a same substrate. For example, the touch sensor pattern may be deposited on the display panel.

As another example, the solar cell layer 310, the touch sensor layer 320, the display panel 350 and the cover glass 360 may be integrated on the same substrate. For example, the photovoltaic material, the touch sensor pattern and the display panel may be deposited on a cover glass substrate.

By integrating layers on the same substrate, adhesive lamination between different layers may be avoided, which may lead to a more straightforward fabrication of the display assembly. The fabrication process may be more efficient and thus cost effective. In addition, technical performance of the display assembly may be better due to a lower light absorption.

Figure 4A:
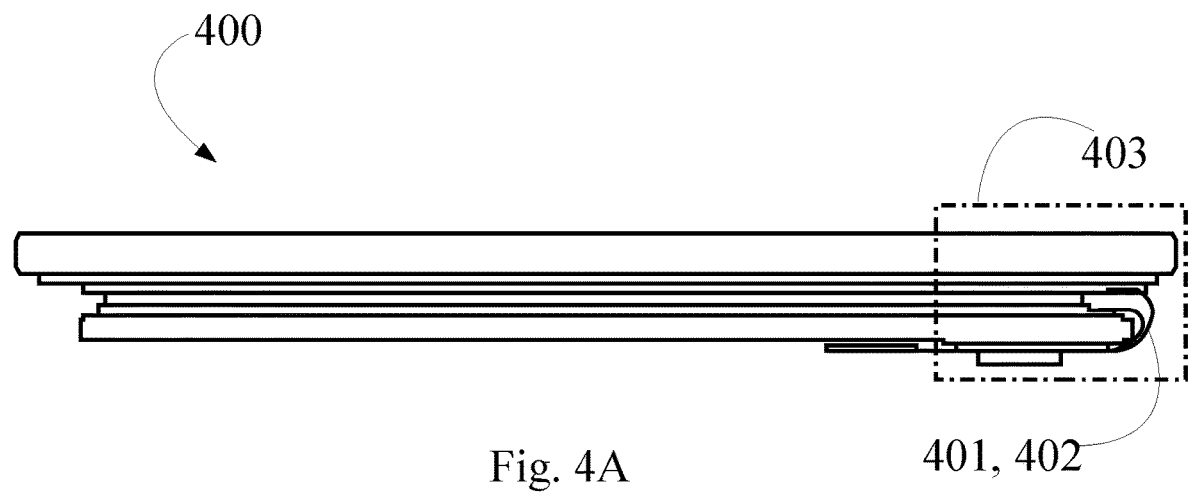
FIG. 4A shows, by way of example, a side view of a display assembly.

FIG. 4A shows, by way of example, a side view of a display assembly 400. The illustration shows different layers of the assembly, and the FPCs 401, 402 connecting, for example, the touch sensor, display panel and the backlight to the processor.

Figure 4B:
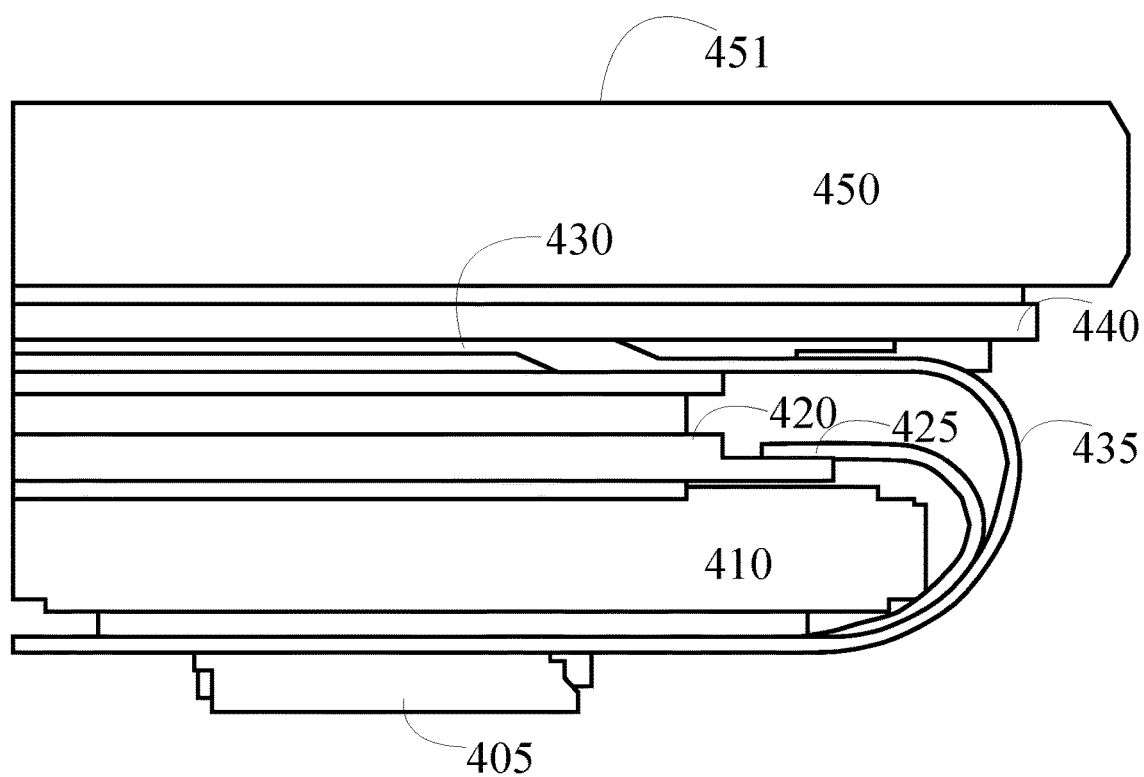
FIG. 4B shows, by way of example, a side view of a display assembly.

FIG. 4B shows, by way of example, a side view of a display assembly. The view is a magnified view of a rectangular area 403 of FIG. 4A. The display assembly 400 comprises a backlight 410 and a display panel 420. The display panel 420 may be a reflective display or a transreflective display, for example, a MIP display. Flexible printed circuit (FPC) 425 is arranged to connect the display panel 420 to a processor via a connector 405. The display assembly comprises a touch sensor layer 430. FPC 435 is arranged to connect the touch sensor layer 430 to the processor. Example of FIG. 4B shows how the FPCs 425, 435 require some space at the edge of the display assembly.

The display assembly comprises a solar cell layer 440. The solar cell layer comprises photovoltaic material or a solar module comprising at least one solar cell arranged at an edge region of the display assembly, as shown in the examples of FIG. 2B and FIG. 2C. The photovoltaic material at the edge efficiently uses the space at the edge which is required by the FPCs 425, 435. The solar cell layer 440 is arranged above the touch sensor layer 430, and thus is closer to the surface 451 of the display assembly and may be able to collect more light. Uniform central region of the touch sensor layer is uncovered by the photovoltaic material, so the solar cell layer does not disturb the functionality of the touch sensor layer.

The display assembly comprises a cover glass 450 for protecting the underlying structures.

Adhesive layers may be comprised in between the layers. Alternatively, some layers may be integrated on a same substrate as described above.

Figure 5:
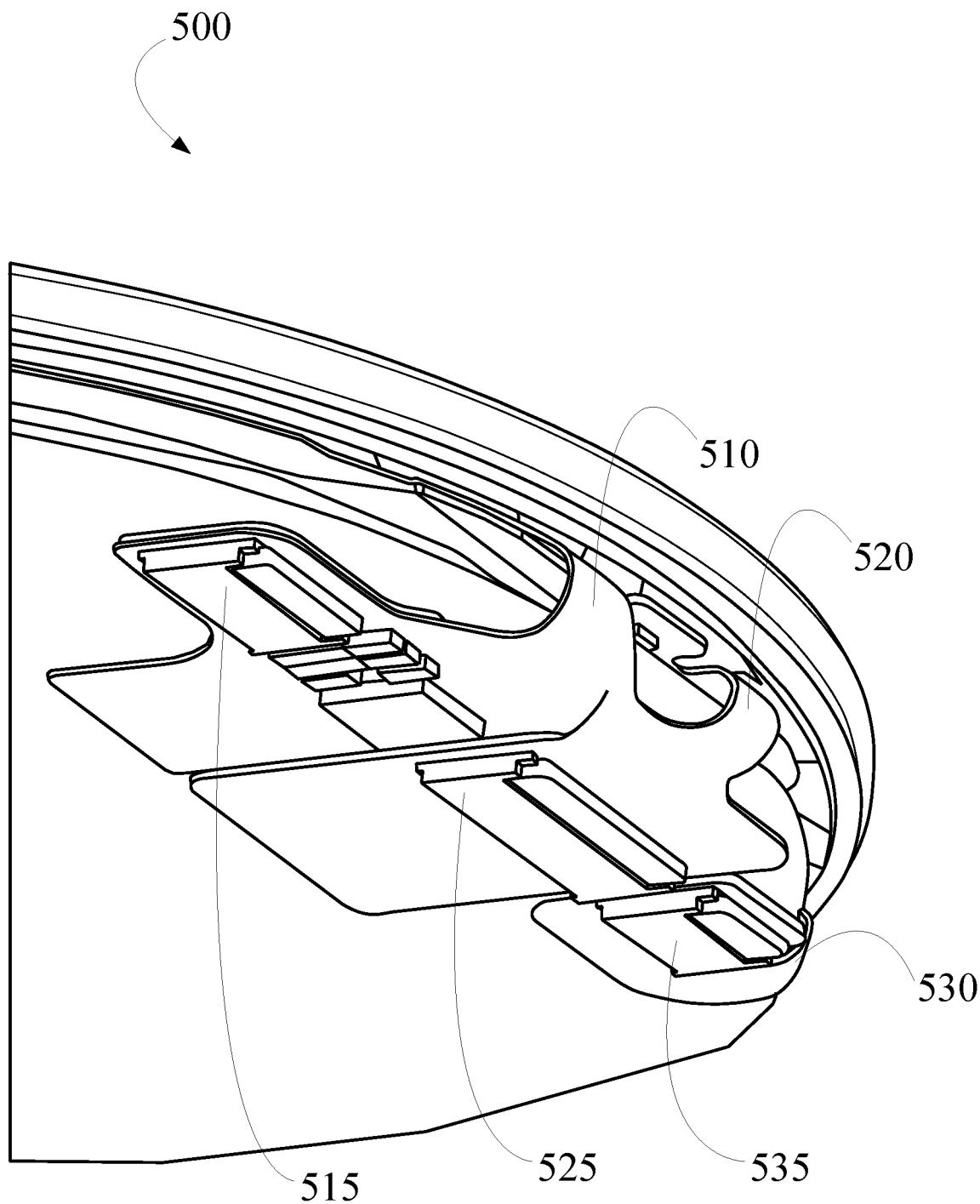
FIG. 5 shows, by way of example, a bottom view of a display assembly.

FIG. 5 shows, by way of example, a bottom view of a display assembly 500. The illustration shows the FPCs 510, 520, 530 of the touch sensor, the display panel and the backlight, and the connectors 515, 525, 535 thereof.

Figure 6:
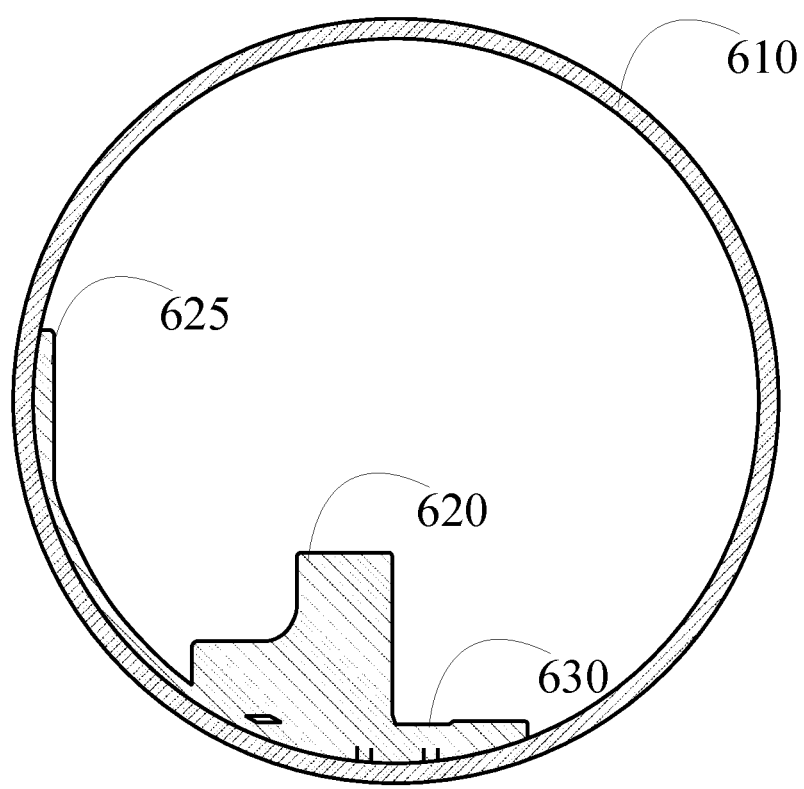
FIG. 6 shows, by way of example, a flexible printed circuit.
Figure 7:
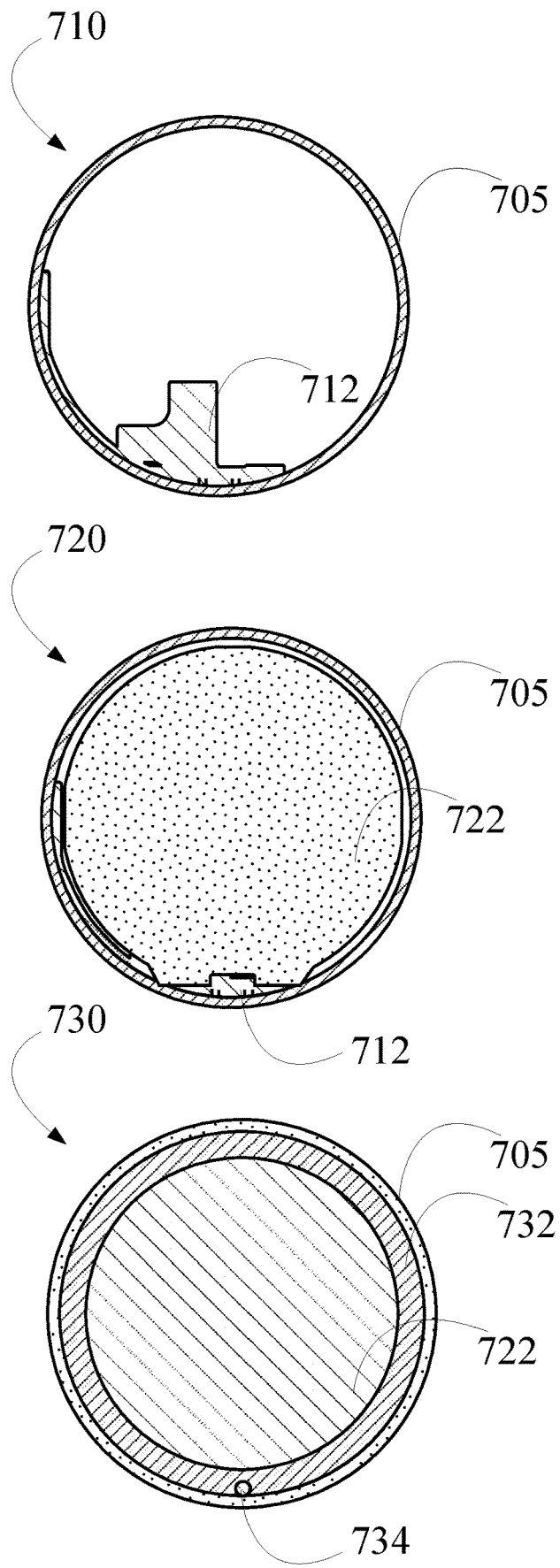
FIG. 7 shows, by way of example, different layers of a display assembly.

FIG. 6 shows, by way of example, a flexible printed circuit 620. A top view of a FPC of the touch sensor is shown. Back print 610 is shown for illustrative purposes. A tail part 625 of the FPC 620 connects to positive and negative terminals of the solar cell. A contact area 630 is the area, wherein the touch sensor connects to the FPC of the touch sensor. Thus, in addition to the bending part of the FPC, the tail part 625 and the contact area 630 of the FPC are visible at the edge of the display area. The back print 610 may be arranged at least partly cover the tail part 625. FIG. 7 shows how the photovoltaic material is arranged to cover the contact area 630.

The same FPC may be used for the touch sensor and for transferring the energy or electricity from the solar cell to the main circuitry of the wearable device. The main circuitry may comprise the charge controller configured to control charging of the battery of the wearable device using electricity produced by the solar cell. Using the same FPC for the touch sensor and the solar cell reduces the number of the circuits and components inside the housing of the wearable device.

FIG. 7 shows, by way of example, different layers of a display assembly. Sub-FIG. 710 shows the FPC 712 of the touch sensor, which may also be used for transferring energy or electricity from the solar cell. Back print 705 is shown for illustrative purposes.

Subfigure 720 shows the back print 705, FPC 712 of the touch sensor and the touch sensor 722.

The touch sensor may comprise a receiver (Rx) electrode layer and a transmitter (Tx) electrode layer. The grid pattern or sensor pattern may be made of transparent material, such as ITO. Sensor traces, which may be made of e.g. copper or silver, are visible at the edges of the touch sensor. A contact area is the area, wherein the touch sensor connects to the FPC of the touch sensor. The contact area and the edges may be efficiently used by a solar cell, which, when positioned above the touch sensor, also covers the contact area and the routing area comprising the traces at the edges.

Subfigure 730 shows the back print 705, FPC 712 of the touch sensor, the touch sensor 722, and a solar module 732, e.g. a solar cell ring. The solar module comprising photovoltaic material is arranged at an edge region of the display assembly leaving a uniform central region of the touch sensor layer uncovered. The solar module covers or hides the traces at the edge and the contact area of the FPC. An ambient light sensor 734 may be located at the edge of the display assembly, and the solar module 732 may comprise a hole for exposing the ambient light sensor to ambient light.

Figure 8:
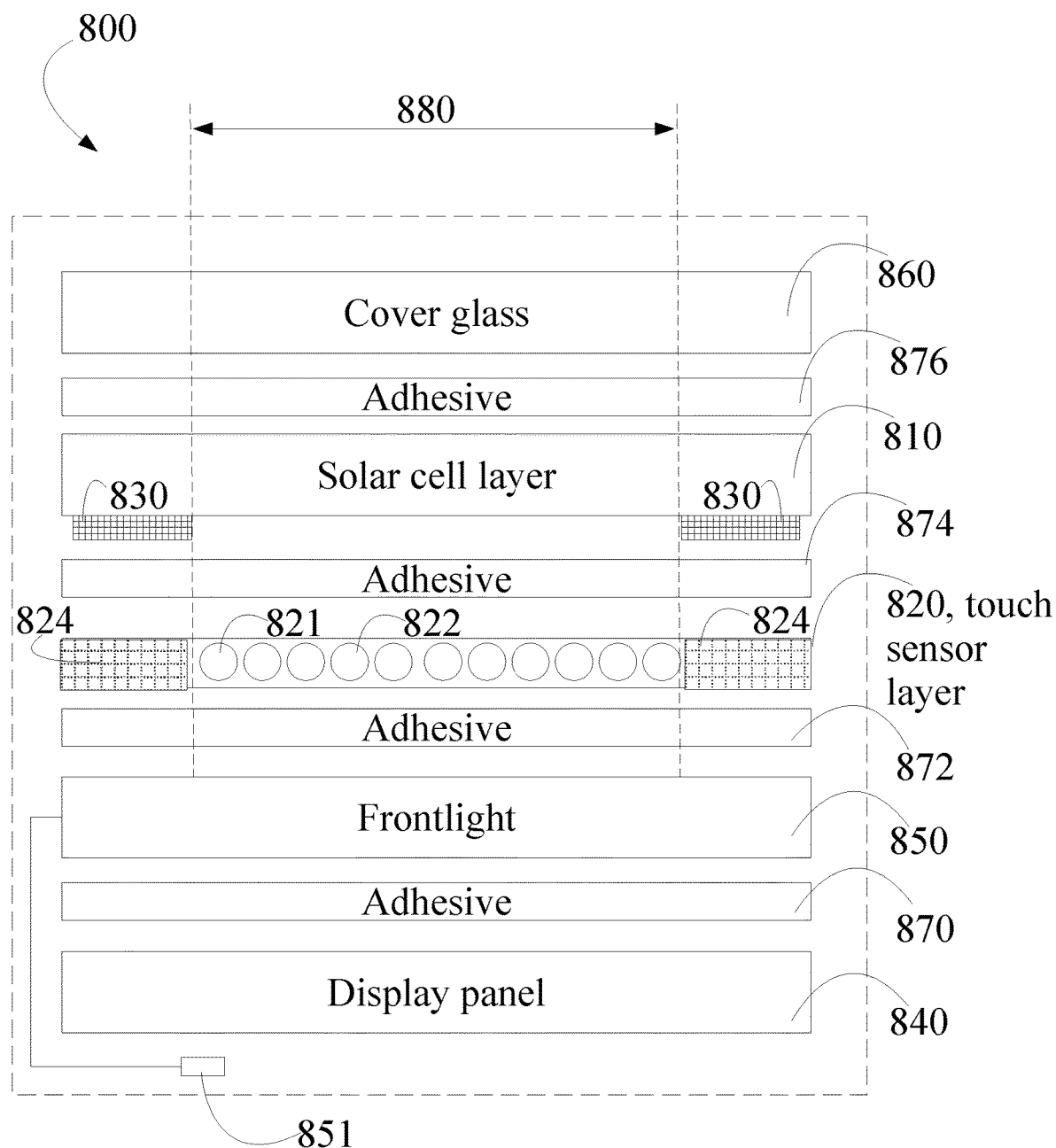
FIG. 8 shows, by way of example, a cross-sectional side view of a display assembly.

FIG. 8 shows, by way of example, a cross-sectional side view of a display assembly 800. The drawing is a schematic drawing of a display assembly. The display assembly 800 comprises a cover glass 860, a solar cell layer 810 comprising photovoltaic material 830 at the edges, and a touch sensor layer 820. The touch sensor layer may comprise, for example, a dual layer ITO touch sensor with column and row traces 821, 822. The solar cell layer 810 comprises photovoltaic material 830 or a solar module comprising at least one solar cell arranged at an edge region of the display assembly leaving a uniform central region 880 of the touch sensor layer uncovered by the photovoltaic material. The uniform central region 880 may also be referred to as an active area of the display, or a visible area of the display, or a viewing area of the display. The uniform central region 880 of the display panel 840 is uncovered by the photovoltaic material 830 of the solar cell layer 810. Area 824 in the touch sensor layer 820, under the photovoltaic material, represents routing area with conductors, e.g. copper or silver conductors. These structures of the display assembly 800 correspond to the structures described in the context of FIG. 3.

The display assembly comprises a display panel 840. Instead of a backlight, the display assembly 800 comprises a frontlight 850, which is arranged above the display panel 840. A light source 851 for the frontlight, e.g. a LED light source, may be located below the display panel 840 or beside the display panel, for example. Position of the light source may depend on how the structure of the display assembly is designed.

The display assembly 800 may comprise adhesives 870, 872, 874, 876 between the layers, or two or more different layers may be integrated on a same substrate, as described above.

Figure 9:
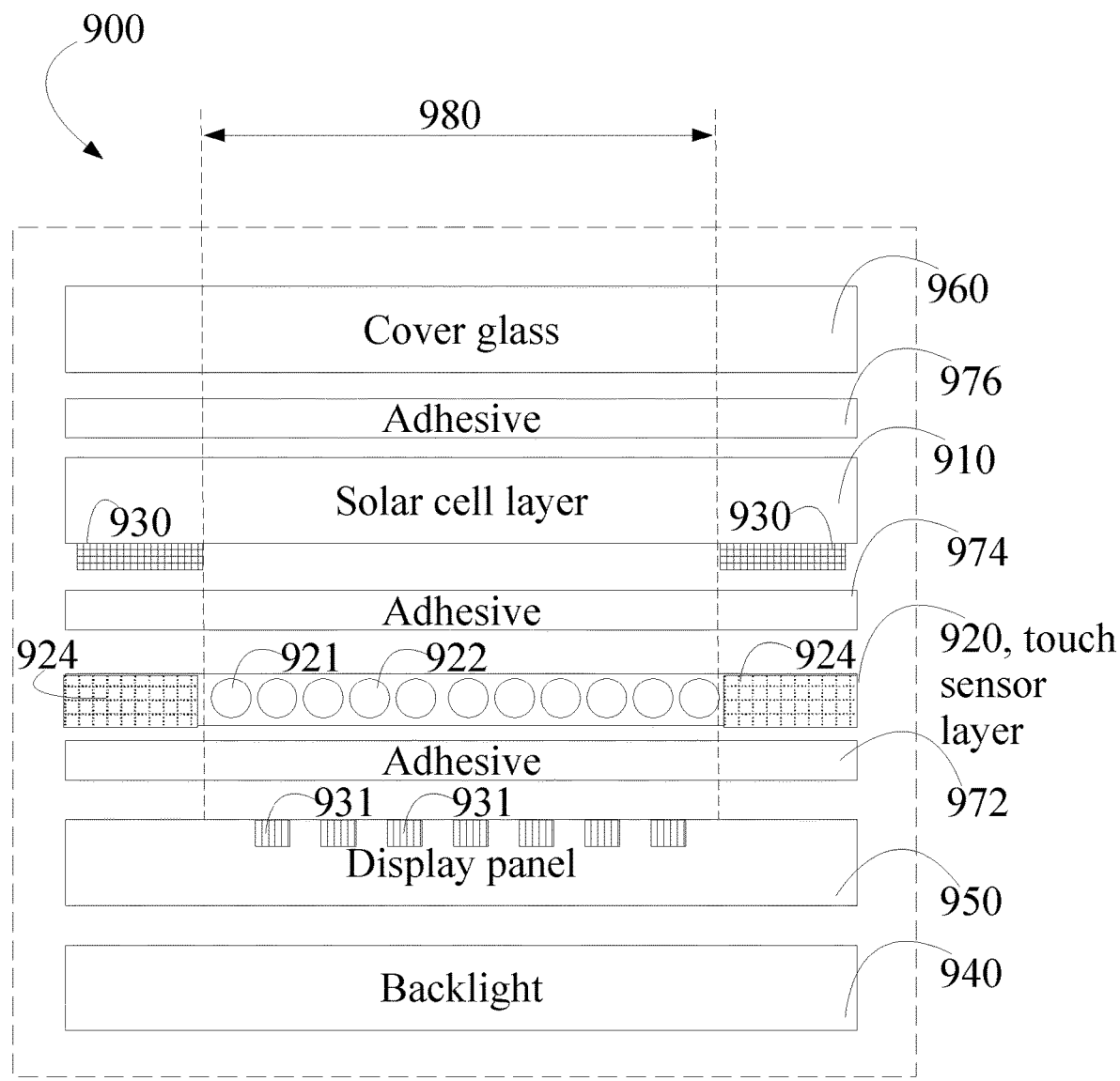
FIG. 9 shows, by way of example, a cross-sectional side view of a display assembly.

FIG. 9 shows, by way of example, a cross-sectional side view of a display assembly 900. The drawing is a schematic drawing of a display assembly. The display assembly 900 comprises a cover glass 960, a solar cell layer 910 comprising photovoltaic material 930 at the edges, and a touch sensor layer 920. The touch sensor layer may comprise, for example, a dual layer ITO touch sensor with column and row traces 921, 922. The solar cell layer 910 comprises photovoltaic material 930 or a solar module comprising at least one solar cell arranged at an edge region of the display assembly leaving a uniform central region 980 of the touch sensor layer uncovered by the photovoltaic material. The uniform central region 980 may be referred to as an active area of the display, or a visible area of the display, or a viewing area of the display. The uniform central region 980 of the display panel 950 is uncovered by the photovoltaic material 930 of the solar cell layer 910. However, the display panel may comprise photovoltaic material 931 as described below. Area 924 in the touch sensor layer 920, under the photovoltaic material, represents routing area with conductors, e.g. copper or silver conductors. These structures of the display assembly 900 correspond to the structures described in the context of FIG. 3.

The display assembly 900 may comprise adhesives 972, 974, 976 between the layers, or two or more different layers may be integrated on a same substrate, as described above.

The display assembly comprises a display panel 950 and may comprise a backlight 940. The display panel 950 may comprise, for example, an LCD display. In some embodiments, the display assembly may comprise a frontlight. The display panel 950 may comprise, for example, an emissive display such as an AMOLED display. The display panel 950 comprises a plurality of pixels. A pixel is composed of individual pixel components, or subpixels, for example, red, green, blue or other color subpixels. The subpixels together appear as a single color to the human eye. Photovoltaic material 931 may be arranged on and/or in the display panel in between the individual pixel components so that the photovoltaic material does not cover the individual pixel components. For example, photovoltaic material may be deposited on a substrate, and some parts of the photovoltaic material may be removed by photoetching such that the individual pixel components are not covered by the photovoltaic material 931 of the display panel 950. As another example, the photovoltaic material may be arranged as photovoltaic strips positioned in between the individual pixel components.

The display assembly 900 comprises the solar cell layer 910 arranged above the touch sensor layer 920. The solar cell layer 910 comprises photovoltaic material 930 arranged at edge region of the display assembly leaving a uniform central region 980 of the touch sensor layer 920 uncovered. The display assembly comprises a display panel 950 comprising a plurality of individual pixel components, and photovoltaic material 931 arranged in between the individual pixel components. Having a first photovoltaic material 930 on the solar cell layer 910 above the touch sensor layer 920, and additionally having a second photovoltaic material 931 in and/or on the display panel 950 in between the individual pixel components, amount of photovoltaic material for collecting light is increased.

Photovoltaic material 930 of the solar cell layer 910 and the photovoltaic material 931 of the display panel 950 are disposed to light in a different manner due to their different locations in the display assembly stack. In addition, solar technology of the photovoltaic material of the solar cell layer and the photovoltaic material of the display panel may be different. Material in these two solar modules may be different so that one may use A-Si and another may use perovskite, for example. Therefore, the efficiency of the photovoltaic material of the solar cell layer may be different from the efficiency of the photovoltaic material of the display panel. Dual maximum power point tracking (MPPT) may be used in charge controllers for extracting maximum available power from the photovoltaic material in various circumstances. This way the amount of harvested energy may be increased.

Figure 10:
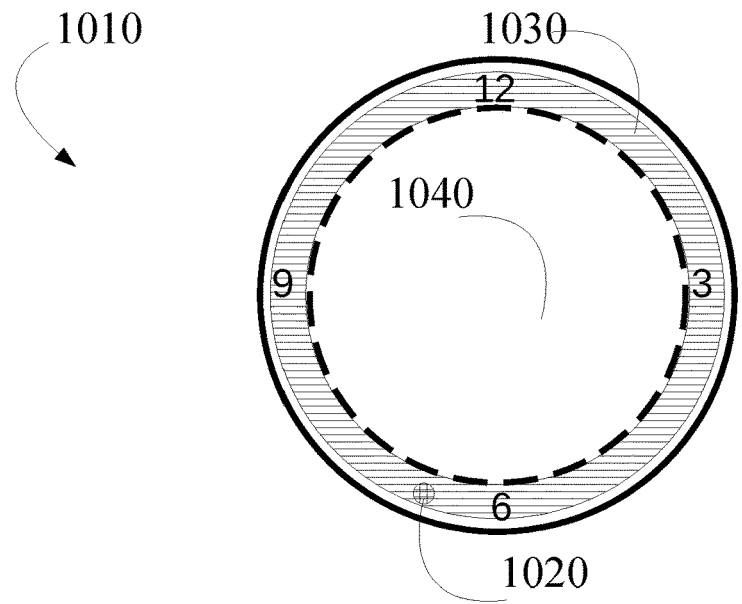
FIG. 10 shows, by way of examples, a top view of a display assembly.
Figure 10:
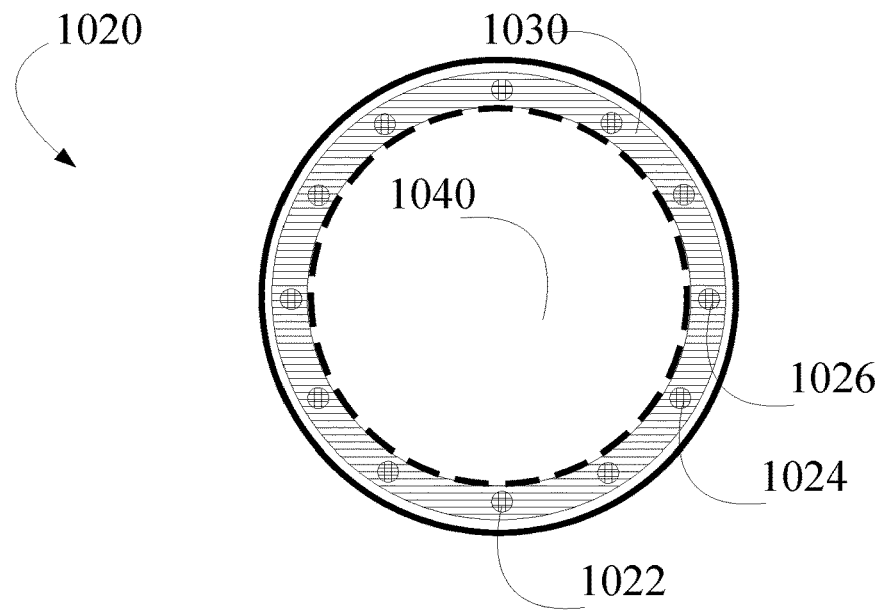

FIG. 10 shows, by way of examples, a top view of a display assembly. Subfigure 1010 shows the photovoltaic material 1030 at the edges of the display assembly. The central region 1040 of the touch sensor layer is not covered by the photovoltaic material. However, the display panel, which is below the touch sensor, may comprise photovoltaic material in between the subpixels as described above.

Photovoltaic material may comprise a hole 1020 for ambient light sensor, or for a camera sensor or a proximity sensor or a lidar, for example. The hole 1020 may be transparent or semitransparent. Graphical elements may be added on or above the photovoltaic material 1030. For example, metals may be deposited on the solar cell. As another example, some areas of the photovoltaic material may be transparent and graphical elements may be printed on those areas. Touch sensor may be arranged to operate also on the photovoltaic area. For example, numbers of a watch face may be printed on the photovoltaic area, and the user may, for example, set a time or alarm by selecting suitable numbers using a finger by a swipe, e.g. a circular swipe, at the edges of the display assembly, where the numbers have been printed on. Thus, the graphical elements printed above the photovoltaic material 1030 assist the user to interact with the wearable device via the touch screen operating on the photovoltaic area.

Subfigure 1020 shows the photovoltaic material 1030 at the edges of the display assembly. The central region 1040 of the touch sensor layer is not covered by the photovoltaic material. However, the display panel, which is below the touch sensor, may comprise photovoltaic material in between the subpixels as described above.

Display panel, for example, emissive display panel such as AMOLED panel, may be arranged to extend to the edges of the display assembly. That is, the display panel extends under or below the photovoltaic material 1030. Photovoltaic material 1030 may comprise holes or openings 1022, 1024, 1026 through which the display panel is visible. The openings 1022, 1024, 1026 reveal parts of the display panel. The touch sensor traces may also be arranged to extend at edge region below the photovoltaic material 1030, or the touch sensor may be integrated into the display panel. Parts of the display panel are visible via the holes 1022, 1024, 1026, and graphical elements may be displayed to the user via those holes.

The openings 1022, 1024, 1026 on the photovoltaic material 1030 exposing parts of the display panel make efficient use of the photovoltaic area, enable wider display area and assist the user to interact with the wearable device via the touch screen operating on the photovoltaic area. For example, graphical elements relating to a dial of a compass may be displayed via the openings, such as degrees and cardinal directions North, South, West and East. The user may interact with the compass via the touch sensor, which may also operate on the photovoltaic area. For example, the user may turn the dial of the compass using the touch sensor operating on the photovoltaic area. As another example, numbers of a watch face may be displayed via the openings on the photovoltaic area, and the user may, for example, set a time or alarm by selecting suitable numbers using a finger by a circular swipe at the edges of the display assembly on the photovoltaic area. Thus, the graphical elements displayed via openings 1022, 1024, 1026 on the photovoltaic material 1030 assist the user to interact with the wearable device via the touch sensor operating on the photovoltaic area.

Figure 11:
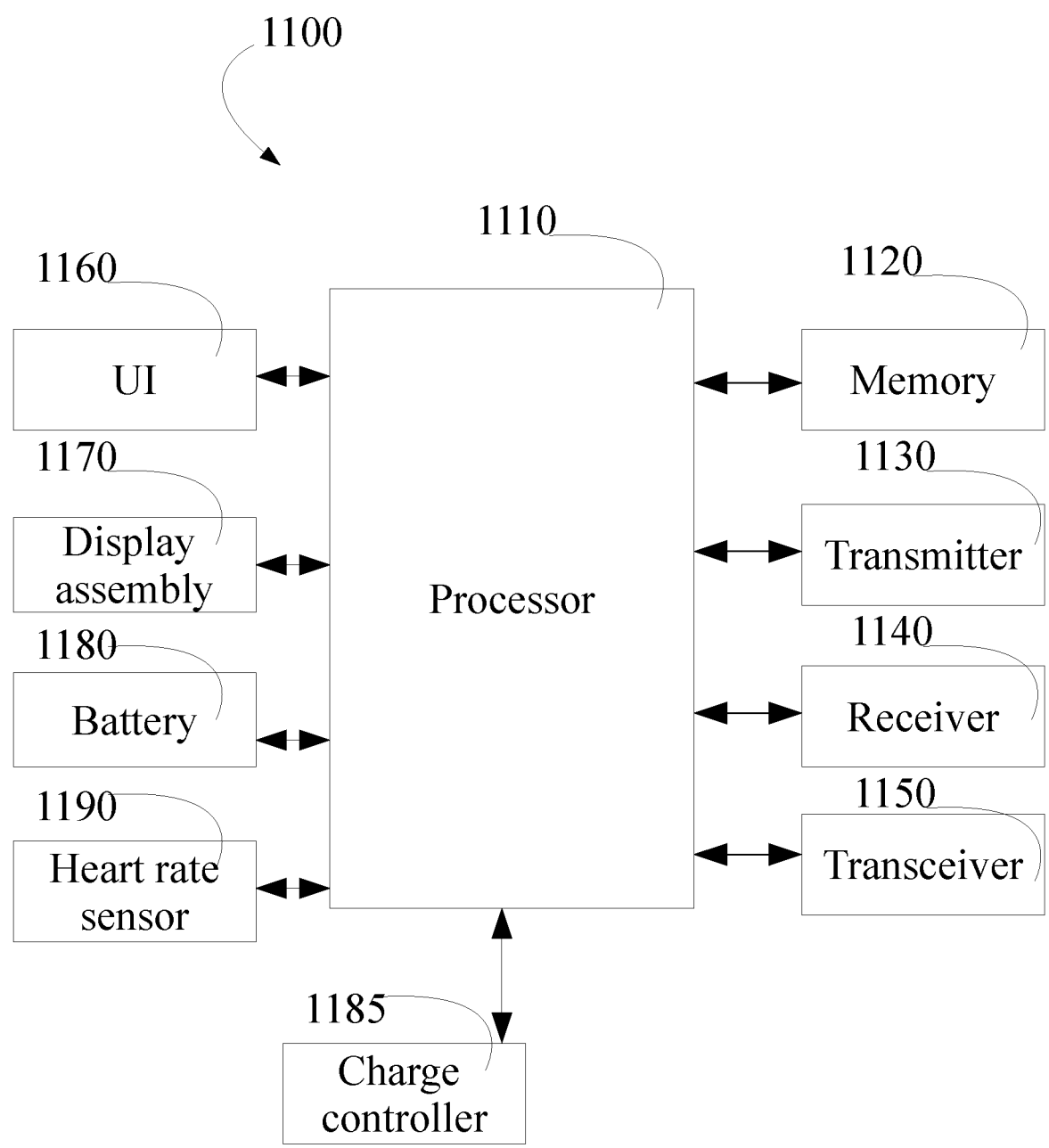
FIG. 11 shows, by way of example, a block diagram of an apparatus.

FIG. 11 shows, by way of example, a block diagram of an apparatus. Illustrated is device 1100, which may comprise, for example, a wearable device such as a sport watch or smart watch 110 of FIG. 1. Comprised in device 1100 is processor 1110, which may comprise, for example, a single- or multi-core processor wherein a single-core processor comprises one processing core and a multi-core processor comprises more than one processing core. Processor 1110 may comprise, in general, a control device. Processor 1110 may comprise more than one processor. Processor 1110 is part of the main circuitry of the device. Processor 1110 may be a control device. A processing core may comprise, for example, a Cortex-A8 processing core manufactured by ARM Holdings or a Steamroller processing core designed by Advanced Micro Devices Corporation. Processor 1110 may comprise at least one Qualcomm Snapdragon and/or Intel Atom processor. Processor 1110 may comprise at least one application-specific integrated circuit, ASIC. Processor 1110 may comprise at least one field-programmable gate array, FPGA. Processor 1110 may be means for performing method steps in device 1100. Processor 1110 may be configured, at least in part by computer instructions, to perform actions.

Device 1100 may comprise memory 1120. Memory 1120 may comprise random-access memory and/or permanent memory. Memory 1120 may comprise at least one RAM chip. Memory 1120 may comprise solid-state, magnetic, optical and/or holographic memory, for example. Memory 1120 may be at least in part accessible to processor 1110. Memory 1120 may be at least in part comprised in processor 1110. Memory 1120 may be means for storing information. Memory 1120 may comprise computer instructions that processor 1110 is configured to execute. When computer instructions configured to cause processor 1110 to perform certain actions are stored in memory 1120, and device 1100 overall is configured to run under the direction of processor 710 using computer instructions from memory 1120, processor 1110 and/or its at least one processing core may be considered to be configured to perform said certain actions. Memory 1120 may be at least in part comprised in processor 1110. Memory 1120 may be at least in part external to device 1100 but accessible to device 1100. Memory 1120 may store one or more recipes provided by a third party.

Device 1100 may comprise a transmitter 1130. Device 1100 may comprise a receiver 1140. Transmitter 1130 and receiver 1140 may be configured to transmit and receive, respectively, information in accordance with at least one cellular or non-cellular standard. Transmitter 1130 may comprise more than one transmitter. Receiver 1140 may comprise more than one receiver. Transmitter 1130 and/or receiver 1140 may be configured to operate in accordance with global system for mobile communication, GSM, wideband code division multiple access, WCDMA, 5G, long term evolution, LTE, IS-95, wireless local area network, WLAN, Ethernet and/or worldwide interoperability for microwave access, WiMAX, standards, for example.

Device 1100 may comprise a near-field communication, NFC, transceiver 1150. NFC transceiver 1150 may support at least one NFC technology, such as NFC, Bluetooth, Wibree or similar technologies.

Device 1100 may comprise a port for a cable for wired data communication or charging. For example, the device may comprise a USB port.

Device 1100 may comprise user interface, UI, 1160. UI 1160 may comprise at least one of a display, buttons, a keyboard, a touch screen, a vibrator arranged to signal to a user by causing device 1100 to vibrate, a speaker and a microphone. A user may be able to operate device 1100 via UI 1160, for example to start and/or stop a workout session, to manage digital files stored in memory 1120 or on a cloud accessible via transmitter 1130 and receiver 1140, or via NFC transceiver 1150. Touch screen may be integrated to a display assembly 1170.

Device 1100 may comprise a display assembly 1170. The display may be operated by the processor(s). The display assembly may the display assembly 200 of FIG. 2A-C or the display assembly 300 of FIG. 3, for example. The display assembly may comprise photovoltaic material for collecting light and the light may be converted to electricity, which may be used for charging the battery 1180 of the device 1100. The device 1100 may comprise a charge controller 1185 configured to control charging of the battery 1180 using electricity produced by the photovoltaic material.

Device 1100 may comprise sensors, such as an acceleration sensor 1180, heart rate sensor 1190, altimeter, moisture sensor, temperature sensor, ambient light sensor, and/or a blood oxygen level sensor.

A method of manufacturing a display assembly for a wearable device comprises providing a touch sensor layer; and arranging, by deposition, a solar cell layer, comprising photovoltaic material, above a touch sensor layer such that the photovoltaic material is arranged at an edge region of the display assembly leaving a uniform central region of the touch sensor layer uncovered.

According to an embodiment, the method of manufacturing comprises arranging a display panel below the touch sensor layer.

When manufacturing the display assembly to produce the display assembly according to various embodiments disclosed herein, some layers may be integrated on a same substrate as described above. Adhesive layers may be deposited between some layers.

Some figures, for example FIG. 7 and FIG. 10, show circular display assemblies. However, it is noted that the display assembly may have other forms, such as a square or a rectangle.

The invention claimed is:

1. A display assembly for a wearable device, the display assembly comprising:
   a solar cell layer; and
   a touch sensor layer, wherein
   the solar cell layer is arranged above the touch sensor layer, wherein the solar cell layer comprises photovoltaic material arranged at an edge region of the display assembly leaving a uniform central region of the touch sensor layer uncovered, wherein
   the photovoltaic material comprises an opening for an ambient light sensor or a proximity sensor or a lidar; and/or
   the photovoltaic material comprises a plurality of openings through which a display panel is visible, wherein a touch sensor of the touch sensor layer extends at the edge region of the display assembly below the photovoltaic material.

2. The display assembly of claim 1, wherein the photovoltaic material is in a form of a ring, a square or a rectangle.

3. The display assembly of claim 1, further comprising:
   a display panel arranged below the touch sensor layer wherein the photovoltaic material comprises the opening for the ambient light sensor or the proximity sensor or the lidar; or
   the display panel is arranged below the touch sensor layer, wherein the photovoltaic material comprises said plurality of openings through which the display panel is visible,
   wherein a touch sensor of the touch sensor layer extends at the edge region of the display assembly below the photovoltaic material.

4. The display assembly of claim 3, wherein the display panel comprises a memory in pixel display, a liquid crystal display, organic light-emitting diode display, active-matrix organic light-emitting diode display, passive-matrix organic light-emitting diode display, micro light emitting diode display, or electronic paper display.

5. The display assembly of claim 3, wherein the display panel comprises photovoltaic material arranged in between individual pixel components of the display panel.

6. The display assembly of claim 1, wherein the solar cell layer and the touch sensor layer are integrated on a same substrate.

7. The display assembly of claim 3, wherein the touch sensor layer and the display panel are integrated on a same substrate.

8. The display assembly of claim 1, further comprising: a cover glass.

9. The display assembly of claim 8, wherein the solar cell layer and the touch sensor layer and the cover glass are integrated on a same substrate.

10. The display assembly of claim 8, wherein the solar cell layer, the touch sensor layer, the display panel and the cover glass are integrated on a same substrate.

11. The display assembly of claim 1, further comprising a flexible printed circuit arranged to connect a touch sensor of the touch sensor layer and a solar module of the solar cell layer to a processor.

12. The wearable device, comprising the display assembly according to claim 1.

13. The wearable device of claim 12, further comprising:
   a battery; and
   a charge controller configured to control charging of the battery with electricity produced by the photovoltaic material.

14. The wearable device of claim 12, which is a smart watch.

15. The display assembly of claim 3, wherein the display assembly comprises a frontlight, which is arranged above the display panel.

* * * * *